United States Patent
Chung et al.

(10) Patent No.: US 11,362,025 B2
(45) Date of Patent: Jun. 14, 2022

(54) TAPE CARRIER ASSEMBLIES HAVING AN INTEGRATED ADHESIVE FILM

(71) Applicant: Daewon Semiconductor Packaging Industrial Company, Santa Clara, CA (US)

(72) Inventors: Sunna Chung, Seoul (KR); John Kim, Santa Clara, CA (US); Ryan Park, Santa Clara, CA (US); Denny Kwon, Santa Clara, CA (US); Matthew Whitlock, Santa Clara, CA (US); Athens Okoren, Hanam (KR)

(73) Assignee: Daewon Semiconductor Packaging Industrial Company, Santa Clara, CA (US)

( * ) Notice: Subject to any disclaimer, the term of this patent is extended or adjusted under 35 U.S.C. 154(b) by 340 days.

(21) Appl. No.: 16/116,840

(22) Filed: Aug. 29, 2018

(65) Prior Publication Data
US 2019/0067072 A1    Feb. 28, 2019

Related U.S. Application Data

(60) Provisional application No. 62/551,758, filed on Aug. 29, 2017.

(51) Int. Cl.
*H01L 23/495* (2006.01)
*H01L 23/00* (2006.01)
(Continued)

(52) U.S. Cl.
CPC ...... *H01L 23/49572* (2013.01); *B29C 51/266* (2013.01); *H01L 21/67333* (2013.01); *H01L 21/6835* (2013.01); *H01L 24/32* (2013.01); *H01L 24/50* (2013.01); *B29C 49/4273* (2013.01); *B29C 51/00* (2013.01);
(Continued)

(58) Field of Classification Search
None
See application file for complete search history.

(56) References Cited

U.S. PATENT DOCUMENTS

| | | | |
|---|---|---|---|
| 5,396,988 A | | 3/1995 | Skrtic |
| 5,682,731 A | * | 11/1997 | Althouse ............... B65D 73/02 53/553 |
| 6,938,783 B2 | * | 9/2005 | Chung ............... H01L 21/6836 211/41.18 |

(Continued)

FOREIGN PATENT DOCUMENTS

JP    02000229692 A  *  8/2000  ............. B65D 85/86

*Primary Examiner* — Linda L Gray
(74) *Attorney, Agent, or Firm* — Perkins Coie LLP; Brian Coleman; Andrew T. Pettit

(57) ABSTRACT

Introduced here are carrier tape assemblies that can improve efficiency and reduce costs when utilized in the handling, transport, or storage of semiconductor components. A carrier tape assembly can include an adhesive film affixed to an elongated and/or extruded carrier tape. For example, the adhesive film may be integrally laminated onto the top surface of the elongate carrier tape as a single continuous (i.e., unbroken) sheet. The adhesive film may substantially conform to the top surface of the elongate carrier tape, including any punched cavities for holding semiconductor components. Proper securement of the semiconductor components to the carrier tape assembly depends on the adhesive property of the constituent material(s) of the adhesive film.

12 Claims, 7 Drawing Sheets

(51) Int. Cl.
  *H01L 21/673*   (2006.01)
  *B29C 51/26*    (2006.01)
  *H01L 21/683*   (2006.01)
  *B29C 49/42*    (2006.01)
  *B29C 51/00*    (2006.01)
  *B29L 31/00*    (2006.01)
  *B29L 7/00*     (2006.01)

(52) U.S. Cl.
  CPC .................... *B29L 2007/007* (2013.01); *B29L 2031/7164* (2013.01); *H01L 24/75* (2013.01); *H01L 2221/68313* (2013.01); *H01L 2224/7565* (2013.01); *Y10T 156/1023* (2015.01); *Y10T 156/1039* (2015.01); *Y10T 156/1043* (2015.01); *Y10T 156/1075* (2015.01); *Y10T 156/1077* (2015.01); *Y10T 156/1089* (2015.01); *Y10T 156/1092* (2015.01); *Y10T 156/1097* (2015.01)

(56) References Cited

U.S. PATENT DOCUMENTS

| | | |
|---|---|---|
| 8,132,673 B1 | 3/2012 | Gutentag |
| 2005/0073037 A1 | 4/2005 | Wright et al. |
| 2006/0213805 A1* | 9/2006 | Thomas, Jr. ...... H01L 21/67386 |
| | | 206/714 |
| 2007/0184243 A1 | 8/2007 | Ono et al. |
| 2008/0000804 A1* | 1/2008 | Carey ................ H05K 13/0084 |
| | | 206/714 |
| 2015/0158649 A1 | 6/2015 | Huang et al. |
| 2017/0062262 A1 | 3/2017 | Newman |

\* cited by examiner

800

801 Receiving an elongate flexible tape

802 Molding the elongate flexible tape to include a central mounting portion interposed between opposing side portions

803 Form at least one cavity in a top surface of the central mounting portion

804 Perforating an array of sprocket holes along at least one opposing side portion

805 Securing an adhesive film to the top surface of the elongate flexible tape

FIGURE 8

TAPE CARRIER ASSEMBLIES HAVING AN INTEGRATED ADHESIVE FILM

CROSS-REFERENCE TO RELATED APPLICATIONS

This application claims priority to U.S. Provisional Application No. 62/551,758, titled "Tape Carrier Assemblies Having an Integrated Adhesive Film" and filed on Aug. 29, 2017, which is incorporated by reference herein in its entirety.

RELATED FIELD

The present technology relates to carrier tapes for protecting semiconductor components and, more specifically, carrier tapes having an integrated adhesive film for holding the semiconductor components in place.

BACKGROUND

Several different configurations have been used to facilitate the transportation of semiconductor components (e.g., packaged semiconductor dies, encapsulated semiconductor dies, or bare semiconductor dies) between different manufacturing/testing sites, namely, stick magazines, injection-molded trays, and carrier tapes. For example, carriers often transport semiconductor components from one location to another location to facilitate the manufacture of integrated circuits (ICs) from the semiconductor components. This is especially true for carriers who are members of the Joint Electron Device Engineering Council (JEDEC), which has established standards for safe handling, transport, and storage of ICs, modules, and other semiconductor components.

Stick magazines (also referred to as a "shipping tubes") can be used to transport and store semiconductor components between the manufacturing site and the assembly site. Stick magazines are also used to feed semiconductor components to automatic-placement machines for surface mounting and through-hole mounting.

Injection-molded trays contain semiconductor components during component-assembly operations, during transport from the manufacturing site to the assembly site, and when feeding the semiconductor components to automatic-placement machines for surface mounting on board assemblies. Shipping trays are typically designed for semiconductor components that have leads (e.g., Quad Flat Package (QFP)/Thin QFP (TQFP) on four sides, Standard Outline Packet (SOP)/Plastic Dual In Line Package (PDIP) on two sides, or TQFP packages) that require lead isolation during shipping, handling, or processing.

Carrier tape can be used for transport from the manufacturing site to the assembly site, as well as storage at the assembly site. Carrier tape (which is often wound around a reel) is designed for feeding semiconductor components to automatic-placement machines for surface mounting on board assemblies or bare silicon side for packaging/encapsulation assembly.

However, these configurations exhibit several limits on, for example, the optimum quantity of semiconductor components per square area due to the limits of individual component retention, the lateral movement during the manufacturing/testing processes due to the design limitations of individual punched cavities (which can contribute to unwanted semiconductor components being inadvertently damaged from handling), etc. Such limitations lead to low manufacturing/handling capacity and high testing costs.

BRIEF DESCRIPTION OF THE DRAWINGS

Various features of the technology will become more apparent to those skilled in the art from a study of the Detailed Description in conjunction with the drawings. Embodiments of the technology are illustrated by way of example and not limitation in the drawings, in which like references may indicate similar elements.

FIG. 8 depicts a process for manufacturing a carrier tape assembly that includes an adhesive film affixed to the top surface of a carrier tape.

Figure 1:
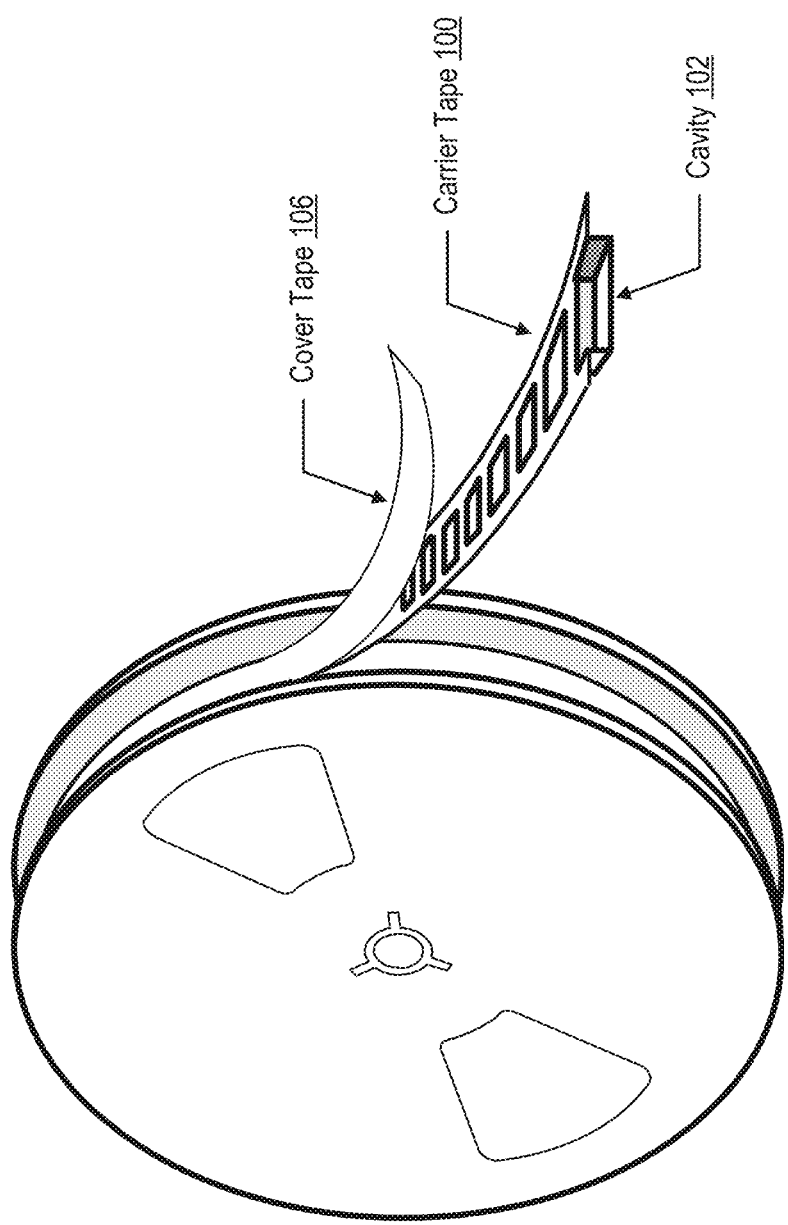
FIG. 1 illustrates how a carrier tape can include a series of cavities (also referred to as "pockets") that are designed to hold semiconductor components and a cover tape that seals the semiconductor components in the cavities.

The drawings depict various embodiments for the purpose of illustration only. Those skilled in the art will recognize that alternative embodiments may be employed without departing from the principles of the technology. Accordingly, while specific embodiments are shown in the drawings, the technology is amenable to various modifications.

DETAILED DESCRIPTION

Carrier tape provides protection to semiconductor components from physical damage and electrostatic discharge (ESD) damage during shipping and storage. Carrier tape is often used for presenting semiconductor components to automatic-placement machines (also referred to as "pick-and-place machines") for automatic placement onto printed circuit boards. Examples of semiconductor components include semiconductor wafers, semiconductor dies (e.g., bumped die or bare die), and other electronic components used in the fabricated of integrated circuits (ICs).

FIG. 1 illustrates how a carrier tape 100 can include a series of cavities 102 (also referred to as "pockets") that are designed to hold semiconductor components and a cover tape 106 that seals the semiconductor components within the cavities 102. Carrier tape 100 is often used in the semiconductor industry because it can reliably prevent semiconductor components from being mechanically/structurally damaged and manipulate electrical properties as required to meet ESD Protected Area (EPA) requirements. However, carrier tape 100 suffers from several drawbacks, including low semiconductor component density (and thus low manufacturing/handling capacity) and high testing costs.

Introduced here, therefore, are carrier tape assemblies that improve efficiency and reduce costs when utilized in the transport of semiconductor components during manufacturing processes and/or testing processes. A carrier tape assembly can include an adhesive film affixed to an elongated or extruded carrier tape. For example, the adhesive film may be laminated onto the top surface of the elongated carrier tape (including any punched cavities) as a single continuous sheet. Proper securement of the semiconductor components to the carrier tape assembly depends on the tackiness of the constituent material(s) of the adhesive film.

Additional information on the installation of adhesive films, as well as the placement of semiconductor components, can be found in U.S. application Ser. No. 16/116,075, titled "Rigid Carrier Assemblies having an Integrated Adhesive Film," which is incorporated by reference herein in its entirety.

Terminology

References in this description to "an embodiment" or "one embodiment" means that the particular feature, function, structure, or characteristic being described is included in at least one embodiment. Occurrences of such phrases do not necessarily refer to the same embodiment, nor are they necessarily referring to alternative embodiments that are mutually exclusive of one another.

Unless the context clearly requires otherwise, the words "comprise" and "comprising" are to be construed in an inclusive sense rather than an exclusive or exhaustive sense (i.e., in the sense of "including but not limited to"). The terms "connected," "coupled," or any variant thereof is intended to include any connection or coupling, either direct or indirect, between two or more elements. The coupling/connection can be physical, logical, or a combination thereof. For example, two devices may be electrically and/or communicatively coupled to one another.

When used in reference to a list of multiple items, the word "or" is intended to cover all of the following interpretations: any of the items in the list, all of the items in the list, and any combination of items in the list.

Technology Overview

Figure 2:
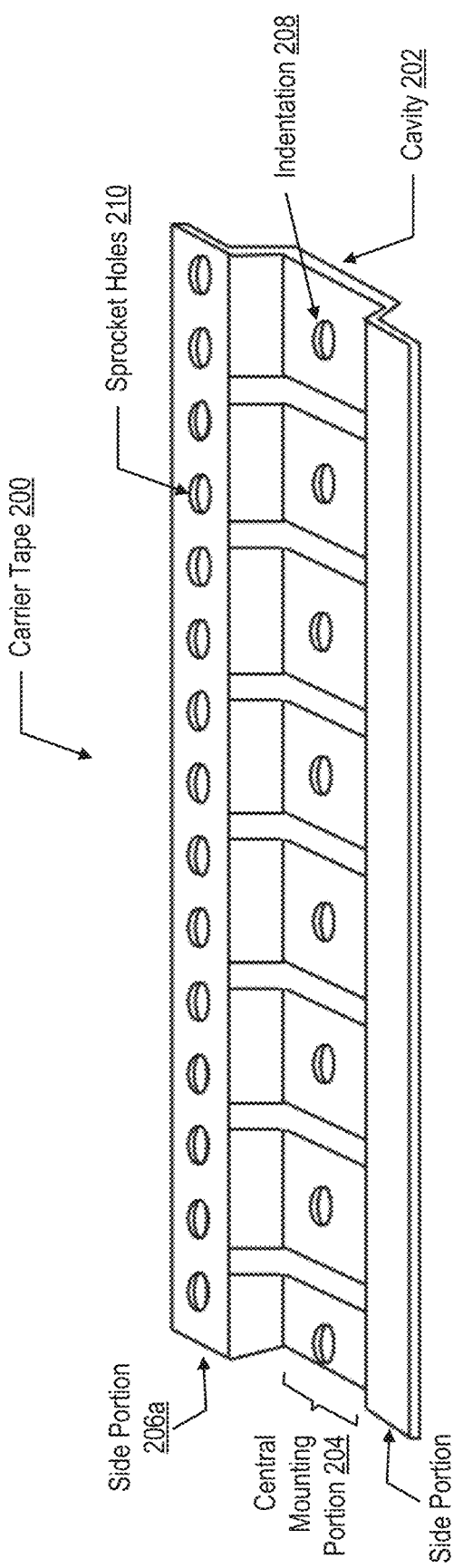
FIG. 2 is a top plane view of a carrier tape that includes a series of cavities disposed along a central mounting portion.

FIG. 2 is a top plane view of a carrier tape 200 that includes a series of cavities 202 disposed along a central mounting portion 204. The central mounting portion 204 is interposed between opposing side portions 206a-b, which are connected to the central mounting portion 204 by pitched sidewalls. In some embodiments, the carrier tape 200 is a pre-formed carrier tape (e.g., a thermoformed carrier tape) having embossed cavities 202. The carrier tape 200 can be comprised of polystyrene, polyester, polyimide, or a combination thereof.

The carrier tape 200 can include an array of sprocket holes 210 linearly arranged along at least one of the opposing side portions 206a-b. Here, for example, sprocket holes 210 have been punched through side portion 206a of the carrier tape 200. While FIG. 2 only shows sprocket holes 210 along one of the opposing side portions, sprocket holes 210 could be punched through both opposing side portions 206a-b. The sprocket holes 210 can be used (e.g., by an automatic-placement machine) for conveying and positioning the carrier tape 200.

Characteristics of the carrier tape 200 (e.g., length and width) may be designed such that the carrier tape 200 is a JEDEC-compliant media carrier. Thus, in some embodiments the carrier tape 200 has a specific height, width, and/or length that allows the carrier tape assemblies introduced here to be utilized for the placement of semiconductor components in JEDEC-compliant processes. JEDEC-compliant carrier tape assemblies may also have a specified density of cavities 202, and each of the cavities 202 may also have a specific height, width, and/or length.

JEDEC compliance may also require a central indentation 208 (or some other structural feature) within each cavity 202. The indentation 208 may be configured to interlock with a complementary structural feature (e.g., a protruding feature) disposed along the outer surface of a semiconductor component. The complementary structural features (i.e., the indentation 208 and the protruding feature) are intended to hold the semiconductor component within the cavity 202 in a specified orientation. Those skilled in the art will recognize that the indentation 208 could also be replaced with a protruding feature, in which case the outer surface of the semiconductor component may have some type of indentation adapted to receive the protruding feature.

Figure 3:
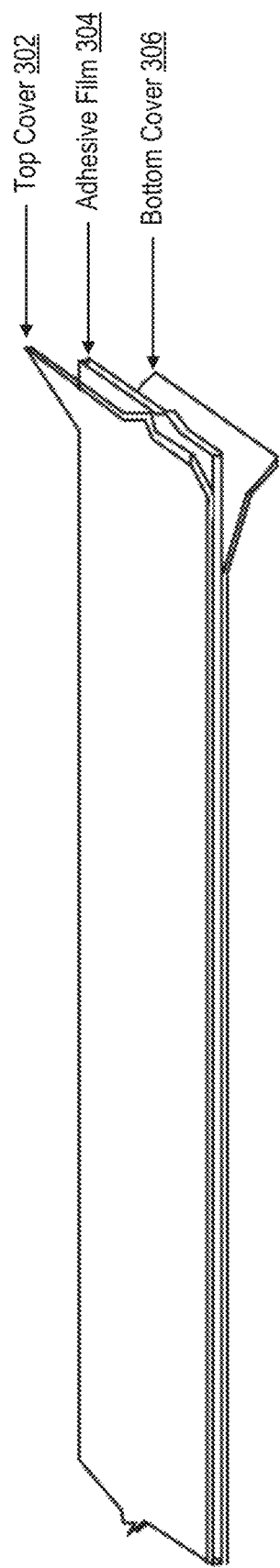
FIG. 3 is a top section view of an adhesive film disposed between a top cover and a bottom cover.

FIG. 3 is a top section view of an adhesive film 304 disposed between a top cover 302 and a bottom cover 306. The adhesive film 304 (also referred to as a "film tape") can be affixed to the top surface of a carrier tape (e.g., carrier tape 200 of FIG. 2) as a single continuous sheet without any breaks. This can be done in several different ways, including via a lamination process, a spray process, or a co-extrusion process.

Here, the adhesive film 304 includes a top cover 302 affixed to the top surface and a bottom cover 306 affixed to a bottom surface. The bottom cover 306 can be removed from the adhesive film 304 before the bottom surface of the adhesive film 304 is affixed to the top surface of the carrier tape. The top cover 302, meanwhile, may be removed from the top surface of the adhesive film 304 before semiconductor component(s) are affixed to the adhesive film 304 (and thus to the carrier tape).

Those skilled in the art will recognize that the top cover 302 and/or the bottom cover 306 may not be present in every embodiment. For instance, a bottom cover 306 is unnecessary when the adhesive film 304 is sprayed directly onto the top surface of the carrier tape. Similarly, a top cover 302 may not be present if semiconductor component(s) are to be secured to the adhesive film 304 soon after the adhesive film 304 is affixed to the top surface of the carrier tape. Accordingly, the term "adhesive layer" may include some or all of these layers (e.g., an "adhesive layer" may only include the adhesive film 304).

The adhesive film 304 can be mounted to the carrier tape such that the adhesive film 304 is laminated along the entirety of the top surface of the carrier tape (including any cavities, such as pre-formed, JEDEC-compliant punched cavities). The adhesive film 304 can be comprised of any suitable adhesive film having sufficient tackiness, while the top cover 302 and the bottom cover 306 can be comprised of any suitable material capable of being readily removed from the adhesive film 304. For example, the adhesive film 304 may include a semi-permanent adhesive.

Figure 4:
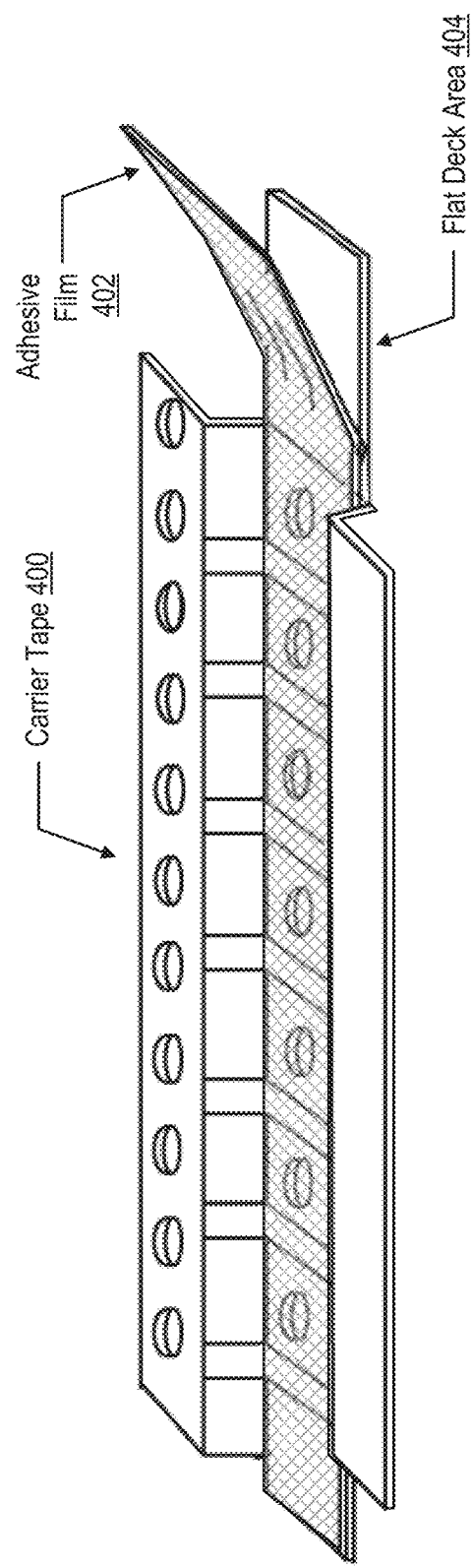
FIG. 4 is a top section view of a carrier tape assembly that includes an adhesive film affixed to a carrier tape.

FIG. 4 is a top section view of a carrier tape assembly that includes an adhesive film 402 affixed to a carrier tape 400. More specifically, the carrier tape assembly includes an adhesive film 402 integrally mounted (e.g., through lamination) to the continuously-punched central mounting portion of the carrier tape 400. The adhesive film 402 can be bonded to a flat area 404 on the deck on one or both ends of the carrier tape 400.

As noted above, a top cover (e.g., top cover 302 of FIG. 3) may be detachably secured to the top surface of the adhesive film 402. In such embodiments, the top cover can be readily removed from the top surface of the adhesive film 402 by being peeled beginning at the flat deck area 404, which may include a pull tab or some other feature that facilitates easy removal.

The surface adhesion (also referred to as "tackiness") of the adhesive film 402 holds semiconductor components (e.g., semiconductor wafers or semiconductor dies) in place as the carrier tape assembly moves. For example, the adhesive film 402 can hold the semiconductor components in a specified orientation during transport/storage or as the semiconductor components are separated/detached through manual or mechanical automation during a manufacturing process or testing process. The adhesive film 402 can ensure that the semiconductor components do not move when the carrier tape 400 is rotated along the x-axis, y-axis, or z-axis, or moved vertically/horizontally with respect to, for example, an automatic-placement machine.

As shown here, the adhesive film 402 can be affixed to the central mounting portion of the carrier tape 400 in a single continuous sheet along the entire length of the carrier tape 400. That is, the adhesive film 402 can be affixed along the entire length of the carrier tape 400 including any cavities, such as pre-formed, JEDEC-compliant punched cavities. The adhesive film 402 generally does not cover the side portions disposed along the outer edges of the carrier tape 400. However, the adhesive film 402 may at least partially cover the pitched sidewalls that connect the central mounting portion to the side portions. Thus, the adhesive film 402 could be secured to the pitched sidewalls leading up to the side portions or the side portions themselves Together, the adhesive film 402 and the carrier tape 400 form a carrier tape assembly that can be used to universally transport media (e.g., singulated silicon wafers or silicon die of the same or different sizes) as necessary for manufacturing, shipping, and/or storing.

Figure 5:
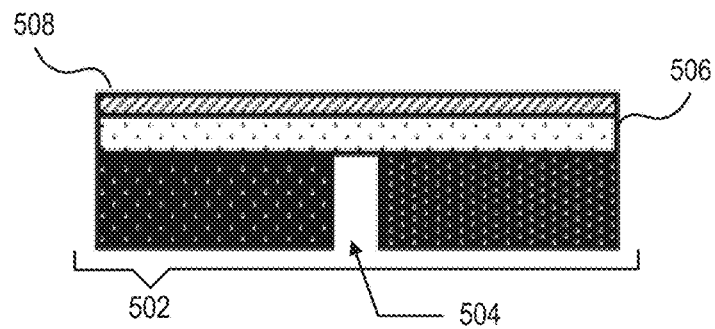
FIG. 5 is a cross-section view of a carrier tape including a punched cavity with a central indentation, an adhesive film, and a top cover.

FIG. 5 is a cross-section view of a carrier tape including a punched cavity 502 with a central indentation 504, an adhesive film 506, and a top cover 508. The top cover 508 may ensure that the top surface of the adhesive film 506 remains sticky, and thus may be removed a short time before a semiconductor component is secured within the punched cavity 502.

The adhesive film 506 can be integrally secured along a central mounting portion of the carrier tape such that the adhesive film 506 conforms to the design of the punched cavity 502. However, the adhesive film 506 may extend across the central indentation 504 as shown here. Consequently, when a semiconductor component is secured within the punched cavity 502, a protruding feature disposed along the outer surface of the semiconductor component may pierce the adhesive film 506 when interconnected within the central indentation 504.

Note, however, that the adhesive film 506 could also conform to the design of the central indentation 504. In such embodiments, the protruding feature of the semiconductor component does not pierce the adhesive film 506, but instead is securely held within the central indentation 504 by the adhesive film 506.

The adhesive film 506 and the top cover 508 may be applied in the same step or different steps. For example, the adhesive film 506 and the top cover 508 may be simultaneously applied after a bottom cover (e.g., bottom cover 306 of FIG. 3) has been removed. As another example, the adhesive film 506 may be applied via a spraying process or a co-extrusion process, and then the top cover 508 may be subsequently applied. In some embodiments, the top cover 508 may simply not be present at all.

Figure 6:
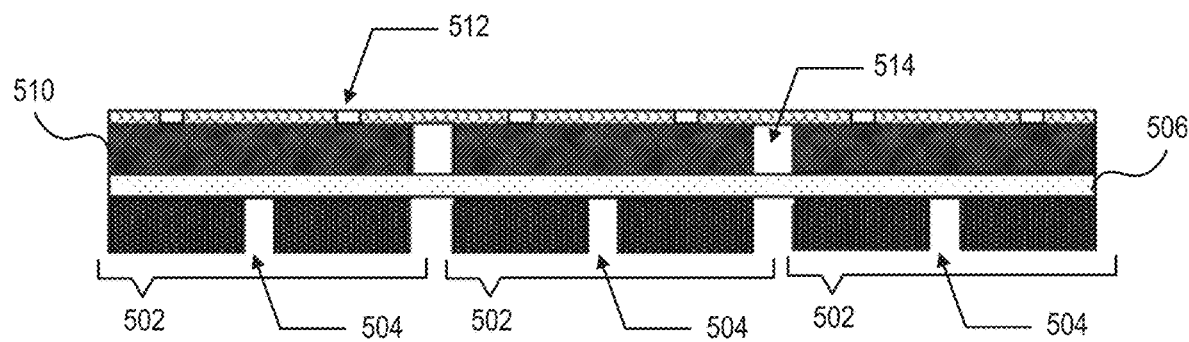
FIG. 6 is a cross-section view of a carrier tape including punched cavities with central indentations and an adhesive film.

FIG. 6 is a cross-section view of a carrier tape including punched cavities 502 with central indentations 504 and an adhesive film 506. In some embodiments, the carrier tape includes an array of punched cavities 502 that are linearly arranged along a central mounting portion interposed between opposing side portions. At least one of the opposing side portions typically includes sprocket holes 512 that can be used for conveying and positioning the carrier tape.

The adhesive film 506 can conform to the design of the central mounting portion of the carrier tape. Thus, the adhesive film 506 may cover the central indentation 504 within each punched cavity 502 and the latitudinal sides of each punched cavity 502, but the adhesive film 506 may not cover the longitudinal sides of each punched cavity 502. The longitudinal sides are defined by the sidewalls 510 of the punched cavity 502 and run parallel to the side portions of the carrier tape, while the latitudinal sides are orthogonal to the longitudinal sides.

In some embodiments, a relief break 514 may be present between some or all of the punched cavities 502. The relief break(s) 514 can be formed in a similar manner as the punched cavities 502 (e.g., punched/molded during a thermoforming manufacturing process). The type/placement of relief break(s) 514 and the type of adhesive film 506 can be selected based on desired impact on camber, flexibility (particularly about the punched cavities 502), propagation prevention (e.g., of semiconductor components from cavity to cavity), etc. The pitch of the sidewalls connecting the central mounting portion to the opposing side portions may also affect some of these items.

The adhesive film 506 serves to hold semiconductor component(s) in place as opposed to conventional carrier tape configurations that rely on the physical specifications of the cavity walls and floor, as well as cover tape. Because the adhesive film 506 can be used on its own to secure semiconductor component(s) to the carrier tape, the carrier tape need not necessarily have punched cavities 502. That is, a carrier tape may have a "pocketless" design and the semiconductor component(s) could be secured to the carrier tape solely by the adhesive film 506. The flexibility of the adhesive film 506 also allows the punched cavities to have non-conventional geometries (e.g., non-rectangular designs).

Figure 7:
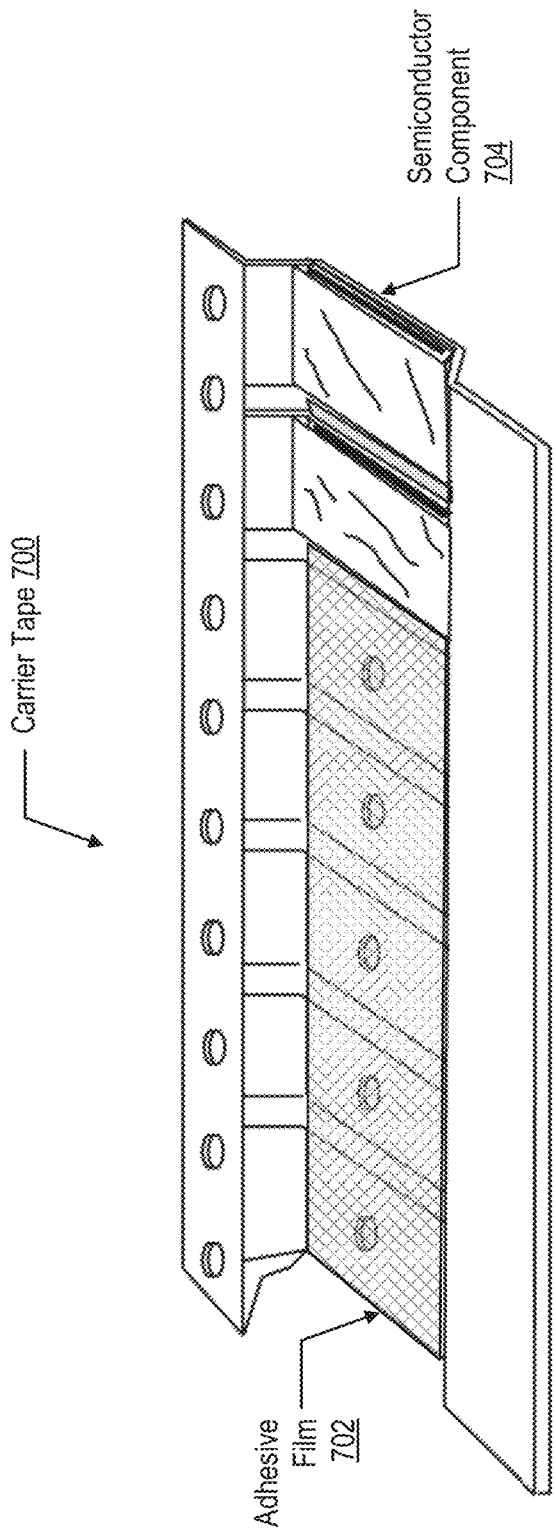
FIG. 7 is a top section view showing a semiconductor component mounted to an adhesive film continuously laminated along the top surface of a carrier tape.

FIG. 7 is a top section view showing a semiconductor component 704 mounted to an adhesive film 702 continuously laminated along the top surface of a carrier tape 700. Together, the adhesive film 702 and the carrier tape 700 form a carrier tape assembly capable of transporting and storing semiconductor components 704 in a space-efficient, cost-efficient manner.

The semiconductor component 704 can utilize the adhesive film 702 (as well as a punched cavity) to position/seat itself in a specified position relative to the remainder of the carrier tape assembly. For example, each semiconductor component 704 may include a structural feature (e.g., a protruding feature) designed to interlock with a complementary structural feature (e.g., an indentation) of a cavity of the carrier tape 700. The complementary structural features are intended to hold the semiconductor component 704 in a specified orientation during transport between various processes (e.g., manufacturing processes and testing processes of an integrated circuit), sites (e.g., manufacturing sites and assembly sites), etc.

When interconnected with the central indentation of a cavity, a protruding feature of the semiconductor component 704 may pierce the adhesive film 702. The remainder of the bottom surface of the semiconductor component 704 may stick to the adhesive film 702. This enables a carrier tape assembly containing one or more semiconductor components to be moved (e.g., vertically and/or laterally) without displacing the semiconductor components from their original orientation.

A tool can be manually or automatically operated to pick up the semiconductor component 704 from the carrier tape assembly, thereby releasing the semiconductor component 704 from the adhesive film 702 in preparation for the next process (e.g., a manufacturing, testing, or storing process).

A cover tape intended to hold the semiconductor component(s) 704 in place may also be affixed over the semiconductor component(s) 704. For example, the cover tape may be disposed over the cavity within which the semiconductor component 704 is secured. In such embodiments, the cover tape may contact the top surface of the semiconductor component 704. The cover tape must be removed before the tool detaches the semiconductor component 704 from the adhesive film 702. Removal of the cover tape and detaching of the semiconductor component 704 may be completed by the same tool or a different tool.

Another object of the technology introduced here is to provide a technique for pre-setting an adhesive film to be affixed (e.g., integrally laminated) to a carrier tape (e.g., an embossed carrier tape) in a simple, reliable manner within a short period of time. FIG. 8 depicts a process 800 for manufacturing a carrier tape assembly that includes an adhesive film affixed to the top surface of a carrier tape.

A manufacturer initially receives an elongate flexible tape (step 801). The elongate flexible tape can be comprised of polystyrene, polyester, polyimide, or a combination thereof. The elongate flexible tape is generally sufficiently flexible such that it can be coiled in a reel, which can be presented to an automatic-placement machine for placement of semiconductor components onto printed circuit boards.

The manufacturer can mold the elongate flexible tape to include a central mounting portion interposed between opposing side portions (step 802). As shown in FIG. 2, the central mounting portion may be on a first plane below the opposing side portions, which are on a second plane that is parallel to, but higher than, the first plane. The depth of the central mounting portion (which is defined by the difference between the first plane and the second plane) can be modified based on the pitch of the sidewalls connecting the central mounting portion to the opposing side portions.

The manufacturer can then form at least one cavity in the top surface of the central mounting portion of the elongate flexible tape (step 803). The size and/or depth of the at least one cavity may vary based on the size of the semiconductor component expected to be placed within each cavity. The manufacturer may also perforate an array of sprocket holes along at least one of the opposing side portions (step 804). The sprocket holes are used to convey and position the elongate flexible tape.

The manufacturer can secure an adhesive film to the top surface of the elongate flexible tape (step 805). For example, the adhesive film may be affixed to the elongate flexible tape as a single continuous (i.e., unbroken) sheet. This can be done in several different ways, including via a lamination process, a spray process, or a co-extrusion process. The adhesive film may have sufficient bonding strength such that it can be integrally mounted into each cavity formed in the top surface of the elongate flexible tape. Semiconductor components may utilize the surface energy and/or tackiness of the adhesive film for seating attachment at a certain density (e.g., a maximum continuous density) along the central mounting portion of the elongate flexible tape.

Because semiconductor components can be mounted directly to the adhesive film rather than via dedicated structural features (e.g., indentations and protruding features), the carrier tape assembly can include a higher density/count of semiconductor components. In fact, the density/count may be determined based on the intended application of the carrier tape assembly in manufacturing, transporting, storing, and/or testing processes.

Unless contrary to physical possibility, it is envisioned that the steps described above may be performed in various sequences and combinations. For example, in some embodiments the elongate flexible tape is a pre-formed carrier tape having embossed cavities. Thus, in some instances the manufacturer may not be required to mold the elongate flexible tape, punch any cavities, or perforate any sprocket holes. Instead, the manufacturer may simply secure the adhesive film to the pre-formed carrier tape (which could be produced by a different manufacturer or the same manufacturer at an earlier point in time).

Additional steps could also be included in some embodiments. For example, the manufacturer (or some other entity) may subsequently secure one or more semiconductor components to the adhesive film of the carrier tape assembly. Moreover, once the semiconductor component(s) have been secured to the carrier tape assembly, a cover tape may be used to hold the semiconductor component(s) in place. The cover tape may only be used in certain situations (e.g., long-distance transport or long-term storage) where the carrier tape assembly and semiconductor components are expected to undergo bumping, shaking, etc.

Although some embodiments are described in the context of certain semiconductor components (e.g., semiconductor wafers or semiconductor dies), those skilled in the art will readily appreciate that the technology can be used to secure other electronic components as well.

Remarks

The foregoing examples of various embodiments have been provided for the purposes of illustration and description. These examples are not intended to be exhaustive. Many variations will be apparent to one skilled in the art. Certain embodiments were chosen in order to best describe the principles of the technology introduced herein, thereby enabling others skilled in the relevant art to understand the claimed subject matter, the various embodiments, and the variations that may be suited to particular uses.

The language used in the specification has been principally selected for readability and instructional purposes. It may not have been selected to delineate or circumscribe the subject matter. Therefore, it is intended that the scope of the technology be limited not by this specification, but rather by any claims that issue based hereon. Accordingly, the disclosure of the technology is intended to be illustrative (rather than limiting) of the scope of the technology, which is set forth in the following claims.

What is claimed is:

1. A method of manufacturing a carrier tape assembly, the method comprising:
    thermoforming a flexible substrate to form an elongate tape having a central mounting portion interposed between opposing side portions;
    embossing a linear array of cavities along the central mounting portion of the elongate tape;
    forming, in each of the cavities, an indentation designed to interlock a protruding feature along an outer surface of a semiconductor component; and securing an adhesive film along at least the central mounting portion of the elongate tape.

2. The method of claim 1, wherein the adhesive film conforms to the cavities.

3. The method of claim 1, wherein the adhesive film extends across each indentation such that the protruding feature of the semiconductor component pierces the adhesive film when interlocked in the indentation.

4. The method of claim 1, further comprising:
perforating a linear array of sprocket holes along at least one of the opposing side portions of the elongate tape.

5. The method of claim 1, wherein the adhesive film is secured along at least the central mounting portion of the elongate tape via a co-extrusion process.

6. The method of claim 1, wherein the adhesive film is secured along at least the central mounting portion of the elongate tape as a single continuous sheet.

7. The method of claim 1, wherein the central mounting portion is connected to the opposing side portions by pitched sidewalls.

8. The method of claim 7, wherein the adhesive film is further secured to at least a portion of the pitched sidewalls.

9. The method of claim 1, wherein the flexible substrate is comprised of polystyrene, polyester, polyimide, or any combination thereof.

10. The method of claim 1, wherein the adhesive film includes a semi-permanent adhesive.

11. The method of claim 1, wherein the adhesive film has (i) a first side that is secured along at least the central mounting portion of the elongate tape and (ii) a second side to which a cover is affixed.

12. The method of claim 11, wherein the cover is detachably secured to the second side of the adhesive film, so as to allow the cover to be removed from the second side of the adhesive film when semiconductor components are to be secured in the cavities.

* * * * *